United States Patent
Krauss (10) Patent No.: US 9,395,065 B2
(45) Date of Patent: Jul. 19, 2016

(54) DEVICE AND METHOD FOR MANIPULATING AN EMISSION CHARACTERISTIC OF A LIGHT-EMITTING DIODE

(75) Inventor: Andreas Krauss, Tuebingen (GB)

(73) Assignee: Robert Bosch GmbH, Stuttgart (DE)

( * ) Notice: Subject to any disclaimer, the term of this patent is extended or adjusted under 35 U.S.C. 154(b) by 293 days.

(21) Appl. No.: 14/111,075

(22) PCT Filed: Feb. 15, 2012

(86) PCT No.: PCT/EP2012/052583
§ 371 (c)(1),
(2), (4) Date: Dec. 24, 2013

(87) PCT Pub. No.: WO2012/139795
PCT Pub. Date: Oct. 18, 2012

(65) Prior Publication Data
US 2014/0098540 A1    Apr. 10, 2014

(30) Foreign Application Priority Data
Apr. 13, 2011   (DE) .......................... 10 2011 007 328

(51) Int. Cl.
*F21V 14/00*  (2006.01)
*H01L 33/58*  (2010.01)
(Continued)

(52) U.S. Cl.
CPC ............ *F21V 14/00* (2013.01); *G02B 19/0009* (2013.01); *G02B 19/0019* (2013.01);
(Continued)

(58) Field of Classification Search
CPC ....... F21S 10/00; F21S 10/026; F21S 10/007; F21V 14/00

USPC ......... 362/232, 233, 239, 270, 283, 284, 271, 362/272, 277, 286, 319, 326, 213
See application file for complete search history.

(56) References Cited

U.S. PATENT DOCUMENTS 8,284,263 B2 * 10/2012 Oohara .................... G02B 7/08
                                                      348/208.4
9,131,135 B2 * 9/2015 Jarvis ................... H04N 5/2254
2009/0067774 A1 3/2009 Magnusson

FOREIGN PATENT DOCUMENTS

CN        1780006 A    5/2006
EP        1 662 585 A2  5/2006
(Continued)

OTHER PUBLICATIONS

International Search Report corresponding to PCT Application No. PCT/EP2012/052583, mailed May 21, 2012 (German and English language document) (5 pages).

*Primary Examiner* — Anabel Ton
(74) *Attorney, Agent, or Firm* — Maginot, Moore & Beck LLP (57) ABSTRACT

A device for manipulating an emission characteristic of a light-emitting diode includes an optical element configured to be movably arranged between a first position and at least one additional position relative to the light-emitting diode. The optical element is configured to bring about a first light distribution of the light emitted by the light-emitting diode if the optical element is arranged in the first position. The optical element is further configured to bring about a further light distribution of the light emitted by the light-emitting diode if the optical element is arranged in the at least one additional position. The device further includes at least one micromechanical actuator configured to move the optical elements between the first and the at least one additional position in order to manipulate the emission characteristic.

20 Claims, 6 Drawing Sheets (51) Int. Cl.
*G02B 26/00* (2006.01)
*G02B 19/00* (2006.01)

(52) U.S. Cl.
CPC .......... *G02B19/0061* (2013.01); *G02B 26/007* (2013.01); *H01L 33/58* (2013.01); *H01L 2224/45144* (2013.01); *H01L 2224/48463* (2013.01); *H01L 2924/1461* (2013.01)

(56) References Cited

FOREIGN PATENT DOCUMENTS

| | | |
|---|---|---|
| EP | 2 211 089 A1 | 7/2010 |
| JP | 2011-65766 A | 3/2011 |
| WO | 2005/040036 A1 | 5/2005 |

\* cited by examiner

DEVICE AND METHOD FOR MANIPULATING AN EMISSION CHARACTERISTIC OF A LIGHT-EMITTING DIODE

This application is a 35 U.S.C. §371 National Stage Application of PCT/EP2012/052583, filed on Feb. 15, 2012, which claims the benefit of priority to Serial No. DE 10 2011 007 328.0, filed on Apr. 13, 2011 in Germany, the disclosures of which are incorporated herein by reference in their entirety.

BACKGROUND

The present disclosure relates to a device for manipulating an emission characteristic of a light-emitting diode, to a light system having a variable emission characteristic, and to a method for manipulating an emission characteristic of a light-emitting diode.

A light-emitting diode emits light, generally non-directionally, from an electrically excited substrate. By casting the substrate with a lens, the light can be concentrated to form a light cone. The light cone comprises a fixed main emission direction of the light-emitting diode.

WO-2005040036-A1 describes a variable optical attenuator for an optical communication system comprising a microelectromechanical drive, which controllably deflects an actuation arm in order to obscure a photodetector in front of a light-emitting part of an optical fiber.

SUMMARY

Against this background, the present disclosure provides a device for manipulating an emission characteristic of a light-emitting diode, a light system having a variable emission characteristic, and a method for manipulating an emission characteristic of a light-emitting diode, according to the disclosure. Advantageous configurations may be found in the respective dependent claims and the following description.

Currently, light-emitting diodes (LEDs) are in a transition phase from use in special applications to widespread replacement of conventional lighting means such as incandescent lamps and fluorescent tubes in all lighting equipment, for example in transport, ceiling lighting and wall lighting or streetlamps. LEDs are very small and almost point light sources. According to the disclosure, LEDs are used not only in the function of point light sources, for example as light chains, and not only in conjunction with conventional large optical systems such as lenses, mirrors or reflectors, but are provided with actuated optics in order to permit variable light distributions. In this way, the great advantage of the LED can be exploited. This is advantageous, for example, in automobile headlights. By using microsystems technology, special application fields for LEDs are opened up. For instance, controllable LED-based automobile headlights can be provided.

LEDs may also be arranged next to one another in a lamp, on a surface which can undertake the backside cooling necessary for LEDs. It is then possible to produce very flat lamps which can be integrated inconspicuously into a wall and ceiling. Light emission may in this case be directed variably.

The approach proposed here produces lamps which are very small but highly variable in terms of their light distribution, and externally controllable, based on LEDs and likewise miniaturized optics. The installation size of the LEDs is not significantly increased in this case.

The disclosure is based on the discovery that light emerging from a light-emitting diode (LED) can be manipulated or shaped by a movable optical element arranged in front of the light-emitting diode. To this end, the optical element may be moved into different positions by means of a device for moving the optical element relative to the light-emitting diode. For example, a lateral emission angle may be manipulated when the optical element is displaced laterally with respect to the light emerging from the light-emitting diode. An aperture angle of a light cone formed by the optical element may be increased or decreased by a variable distance between the light-emitting diode and the optical element. If a micromechanical device is used for moving the optical element, then an installation size of the overall arrangement can be kept small. By means of the optical element, with a stationary light source, a space in front of the light source can be illuminated with different light scenarios.

The present disclosure provides a device for manipulating an emission characteristic of a light-emitting diode, the device comprising the following features:

an optical element, which can be arranged movably relative to the light-emitting diode between a first position and at least one further position, and is formed in order to induce a first light distribution of the light emitted by the light-emitting diode when the optical element is arranged in the first position, and in order to induce a further light distribution of the light emitted by the light-emitting diode when the optical element is arranged in the at least one further position; and at least one micromechanical actuator for moving the optical element between the first position and the at least one further position, in order to manipulate the emission characteristic.

An emission characteristic of a light-emitting diode may be understood as a shape and/or a direction of a light cone or of a light density distribution, which is emitted by the light-emitting diode. A light-emitting diode may be a semiconductor component which emits light from a substrate of the semiconductor component owing to an applied flow of current. The light-emitting diode may also be referred to as an LED. An optical element may shape the light of the diode by optical effects, for example reflection, refraction, diffraction and scattering, to form a light distribution. In this case, an incidence angle of the light of the diode into the optical element may have an influence on an emergence angle of the light of the light cone from the optical element. If the optical element is moved in the light of the light-emitting diode, the incidence angle of the light can be modified. As a result, the emergence angle of the light is also modified. The emission characteristic may represent a totality of the emergence angles of the light from the optical element and/or the light-emitting diode. The light distribution may have regions with a high light intensity and regions with a low light intensity. The first light distribution may have a different emission characteristic to the further light distribution. A micromechanical actuator may be understood as a structure whose components have very small dimensions, for example in the micrometer range. The actuator may, for example, be made of silicon or a similar material, for example silicon carbide, gallium arsenide or gallium nitride. A movable end of the micromechanical actuator may be moved between at least two positions under the effect of electrical energy.

For example, the end of the micromechanical actuator may occupy a particular setting between the at least two positions owing to a particular applied voltage level. The movable end of the micromechanical actuator may be connected to the optical element. Another end of the micromechanical actuator may, for example, be connected to a circuit board of the light-emitting diode. In this way, the micromechanical actuator can move the optical element relative to the light-emitting diode.

According to another embodiment of the present disclosure, the actuator may be formed in order to move the optical element perpendicularly or, as an alternative or in addition, parallel to a main extent plane of the light-emitting diode. A perpendicular movement of the optical element may be understood as an increase or decrease of a distance between a main extent plane of the optical element and a main extent plane of the light-emitting diode. When there is a large distance, for example, the light can enter the optical element and emerge from the optical element as a light cone having a small aperture width. When there is a small distance, for example, the light can emerge from the optical element as a light cone with a large aperture width. In this way, the light cone can become "wider" when the optical element is closer to the light-emitting diode. By a movement parallel to the main extent plane of the light-emitting diode, a distance between an optical axis of the optical element and a main emission axis of the light-emitting diode can be varied. By a movement of the optical element perpendicularly or parallel to the main extent plane of the light-emitting diode, or by a combination of the movement directions, the light cone formed by the optical element can be manipulated in terms of its emission characteristic.

The optical element may be a lens, an optical grating or an optical mirror unit. A lens may be understood as an optically active element having two light-refracting surfaces, at least one of the two light-refracting surfaces being convexly or concavely curved. The light-refracting surfaces may be subdivided into subsurfaces. For example, the lens may be a Fresnel lens. An optical mirror unit may be understood as a reflective surface having very small dimensions. The reflective surface may be subdivided into subsurfaces. The reflective surface may be planar, convex or concave. For example, the optical mirror unit may have metallized surfaces, on which the light of the light-emitting diode can be reflected in order to form the light cone. A Fresnel lens can be produced so as to be very thin and therefore very lightweight, and can therefore be accelerated very rapidly owing to a low inertial mass. An optical mirror unit may be produced in the same working process as that in which the micromechanical actuators are produced.

The micromechanical actuator may be configured as an electrostatic, thermal, piezoelectric or magnetic actuator. The actuator may also be formed in order to employ a combination of electrostatic, thermal, piezoelectric and magnetic principles. The actuator may in this case implement a combination of all or some of the aforementioned principles. The drive may be formed in order to employ the principles for a drive of the optical element. As an alternative or in addition, the drive may be formed in order to employ the principles for position detection of the optical element.

The actuator may have a bearing lever for moving the optical element in at least one spatial direction. A bearing lever may be understood as a mechanical component for connecting the actuator to the optical element. Owing to its shape, for example an L-shape, the bearing lever can transmit a movement of the actuator in at least one spatial direction to the optical element. For example, the bearing lever may transmit movements in three spatial directions to the optical element. In this case, the actuator may be formed in order to move the optical element in three spatial directions.

The actuator may have a friction bearing as an interface between the optical element and the actuator. A friction bearing may be understood as a bearing point which is formed in order to retain the optical element in at least one spatial direction by friction when the actuator is not accelerating, moving or applying a force to the optical element. In the case of miniaturized optical elements and actuators, in particular surface forces at defined support points may be used as a required friction force. In silicon microsystem technology, this effect is known as a perturbing phenomenon (sticking). Such a friction bearing may also be used in combination with inertial movement: when the actuator is moved with a high acceleration, the optical element can slide on the friction bearing in the at least one spatial direction owing to its mass inertia, and change a position on the friction bearing. When the actuator moves the friction bearing slowly with a low acceleration, the optical element can retain the position on the friction bearing in the at least one spatial direction owing to a friction force. If, after an acceleration which causes displacement of the optical element, the actuator returns with a movement in which the optical element is not moved with it into a starting position, then the optical element has changed its position relative to the light-emitting diode and the actuator owing to the displacement in comparison with a state before the acceleration. By multiple repetition of this cycle, the optical element can be displaced over a region which is much larger than the maximum possible range of the individual movement of the actuator.

If the actuator is configured in such a way that it can be moved in multiple spatial directions, by a movement in a first direction an optical element can advantageously be raised from a basic position in this first direction, for example against a spring force, so that a friction bearing is released and easy displacement in at least one further spatial direction is made possible. After the positioning, the basic position in the first direction is resumed, whereupon a stable position is obtained owing to the friction and optionally by a spring force.

According to another embodiment of the present disclosure, the device comprises a frame enclosing the light-emitting diode, the actuator being connected to the frame. A frame may be understood as a component for fastening the device on the light-emitting diode. The frame may enclose the diode fully or partially in a main extent plane of the diode. The frame may support the at least one actuator perpendicularly to a movement direction of the actuator. The at least one actuator and the frame may be configured integrally. The micromechanical structure of the actuator may be machined from the frame. Owing to the frame, the device can have a high stability. The frame may have an adhesive surface or a fastening surface, in order to be connected firmly to the light-emitting diode. Advantageously, the connection between the light-emitting diode and the frame is carried out not on the individual component but already at the wafer level, for example in the form of wafer bonding. In this case, the wafer bonding may also take place in a precursor of the actuator, in which the frame is present not as an individual component but only as a part of a wafer. The frame may have guide surfaces for guiding the optical element in at least one spatial direction.

According to another embodiment for the present disclosure, the frame may have at least one supply conductor for the actuator, or alternatively or in addition the light-emitting diode. A supply conductor may be understood as an electrical conductor track. By integration of the supply conductor into the frame, the at least one actuator can be contacted particularly straightforwardly. If a supply conductor for the light-emitting diode is integrated into the frame, the light-emitting diode may be electrically contacted in the same working step as the at least one actuator. The frame may be formed in order to be locally connected electrically conductively to the light-emitting diode. Advantageously, the frame is configured in such a way that it has a high thermal conductivity, in order to be able to dissipate or distribute power loss in a controlled way.

The frame may furthermore have a support surface for the optical element, which is formed in order to bear the optical element displaceably. A retaining force may in this case act between the optical element and the support surface. The retaining force may be induced by adhesion and/or cohesion. In addition or as an alternative, the device may have a spring and the retaining force may be induced by a spring. A support surface may be understood as a contact surface, between the optical element and the frame, on which the optical element is in contact with the frame in a resting state. The optical element may be arranged on the frame by a friction bearing. For movement by the actuator, the optical element may for example be raised from the support surface, moved and placed on the support surface again, in which case the optical element may occupy a modified position on the support surface.

Between the optical element and the support surface, there may for example be static friction which can be influenced by the surface condition of the support surface and/or of the optical element. In addition, the optical element may be pressed onto the support surface by a spring or compression spring. In this case, the actuator can move the optical element with a large dynamic range, since the optical element can be secured against unintended "flying off" by the spring. The optical element may likewise be retained on the support surface by liquid friction and/or surface tension. In this case, the physical properties of a contact fluid between the optical element and the frame induce resistive forces which the actuator can overcome in order to move the optical element. A surface condition of the optical element and/or of the frame may induce molecularly based attraction forces, which retain the optical element securely when the optical element is in contact with the support surface. The actuator can overcome the attraction forces and move the optical element, in order to place the optical element back on the frame in a different position. In this way, the actuator can move the optical element over a large adjustment path with a multiplicity of successive small movement steps.

In one embodiment, the device may have a first actuator which is connected to a first corner of the optical element in order to move the optical element, a second actuator which is connected to a second corner of the optical element in order to move the optical element, and a third actuator which is connected to a third corner of the optical element in order to move the optical element. By connection of the actuators to the optical element at three corners, the optical element can be moved particularly straightforwardly and with a particularly small number of actuators. Both linear movements and tilting movements can therefore be executed. The optical element may, for example, be configured triangularly or hexagonally. In this way, a particularly dense packing density of a plurality of light-emitting diodes next to one another can be achieved. In the case of a triangular arrangement, sawing or partial or full separation of components may in particular also be carried out at the wafer level, only parallel movements of the separating device in three directions being necessary for this. In order to simplify this separation, the arrangement of the light-emitting diodes and optical elements, or actuators, may be covered by a fixed optical transmissive layer into which further optical elements, for example filters, lenses, and electrical elements, for example contact pads, may be incorporated.

The present disclosure furthermore provides a light system having a variable emission characteristic, having the following features:

a light-emitting diode; and a device for manipulating an emission characteristic of a light-emitting diode according to the approach presented here, wherein a first end of the actuator is connected to the optical element, and a second end of the actuator is connected to the light-emitting diode.

In the case of a light system, an actuator may be formed in order to modify an intermediate space between the light-emitting diode and the optical element according to a drive signal. The actuator may also be formed in order to keep the distance constant in the absence of the drive signal. The actuator may displace the optical element relative to the light-emitting diode in a displacement plane in response to a displacement signal. The actuator may also be formed in order to keep the optical element in a position when the actuator is not being driven by a displacement signal. The optical element may also be held or clamped in a position by at least one spring.

Furthermore, the disclosure also comprises a method for manipulating an emission characteristic of a light-emitting diode of a light system comprising the light-emitting diode, an optical element and at least one micromechanical actuator, wherein the optical element is arranged movably relative to the light-emitting diode between a first position and at least one further position, and is formed in order to induce a first light distribution of the light emitted by the light-emitting diode when the optical element is arranged in the first position, and in order to induce a further light distribution of the light emitted by the light-emitting diode when the optical element is arranged in the at least one further position, and wherein the actuator is formed in order to move the optical element between the first position and the at least one further position, the method comprising the following step:

driving the at least one actuator with a drive signal for moving the optical element, in order to manipulate the emission characteristic.

A drive signal may be understood as an electrical signal. The drive signal may for example actuate the actuator electrostatically, electrothermally, electromagnetically or piezoelectrically. The drive signal may be provided to the actuator by a drive device. If the light system comprises a plurality of diodes, the drive signal may be provided to the corresponding actuators of the diode.

BRIEF DESCRIPTION OF THE DRAWINGS

The disclosure will be explained by way of example in more detail below with the aid of the appended drawings, in which.

DETAILED DESCRIPTION

In the following description of preferred exemplary embodiments of the present disclosure, identical or similar references are used for elements represented in the various figures and having the same effect, repeated description of these elements being omitted.

Figure 1:
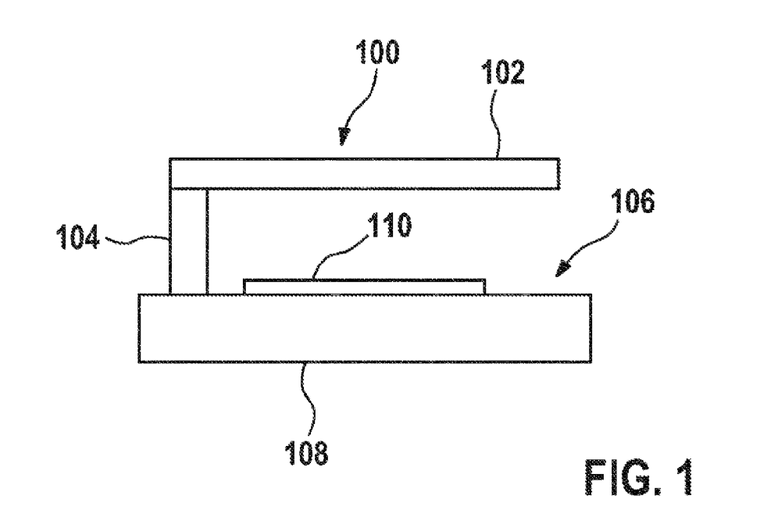
FIG. 1 shows a representation of a device for manipulating an emission characteristic of a light-emitting diode according to an exemplary embodiment of the present disclosure.

FIG. 1 shows a representation of a device 100 for manipulating an emission characteristic of a light-emitting diode 106 according to an exemplary embodiment of the present disclosure. The device 100 has an optical element 102 and at least one micromechanical actuator 104 for moving the optical element 102. The light-emitting diode 106 has a carrier circuit board 108 and a light-emitting substrate 110. When the substrate 110 is excited by an electrical current between a cathode and an anode of the diode 106 in order to shine, the substrate 110 emits light in all directions via surfaces of the substrate 110. Since the substrate 110 has a large surface on a side facing away from the circuit board 108, the substrate 110 generally emits the majority of the light there. In the representation depicted, this light propagates approximately in the shape of a half-cone from the substrate 110. After the light has crossed an intermediate space between the substrate 110 and the optical element 102, the light enters the optical element 102. The optical element 102 is formed in order to deviate the light and form a light cone. The light cone emerges from the optical element 102, on a side facing away from the light-emitting diode 106, from the optical element 102. When the optical element 102 has a first position relative to the light-emitting diode 106, the light cone has a first light distribution. When the optical element 102 has a further position, different from the first position, relative to the light-emitting diode 106, the light cone has a further light distribution different from the first light distribution. The optical element 102 is connected to the light-emitting diode 106 by the micromechanical actuator 104. The actuator 104 is fastened on the circuit board 108. The micromechanical actuator 104 is formed in order to move the optical element 102 between the first position and at least the further position. To this end, the actuator 104 may be excited by a drive signal. In another arrangement (not shown), the substrate 110 may also preferably emit light into an optically transmissive circuit board 108, so that the light cone emerges from the circuit board on a side facing away from the substrate or next to the substrate. The arrangement of the actuator 104 and of the optical element 102 may be adapted correspondingly.

Figure 2:
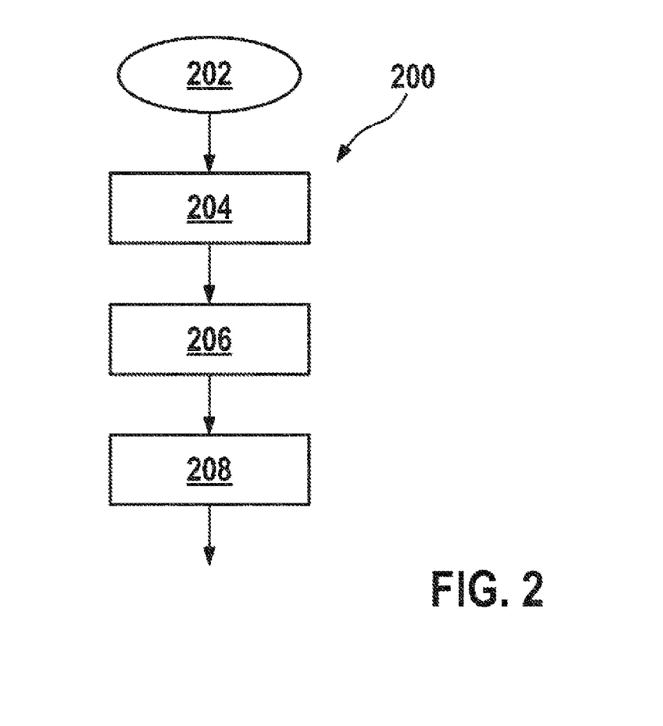
FIG. 2 shows a flow chart of a method for manipulating an emission characteristic of a light-emitting diode according to an exemplary embodiment of the present disclosure.

FIG. 2 shows a flow chart of a method 200 for manipulating an emission characteristic of a light-emitting diode according to an exemplary embodiment of the present disclosure. The diode may be the diode shown in FIG. 1. The method 200 has a request step 202, a determination step 204, a definition step 206 and a drive step 208. In response to the request 202 of an emission characteristic for the light-emitting diode, for example by a control device, a position for the optical element in order to adapt the optical element to the emission characteristic is determined in the determination step 204. On the basis of the position determined, in the definition step 206 an actuator adjustment path for moving the optical element into the determined position is defined. In the drive step 208, the actuator is driven with a drive signal in order to adjust the actuator by the actuator adjustment path. In response to the drive signal, the actuator moves the optical element by the actuator adjustment path into the determined position. As soon as the optical element is in the determined position, the light-emitting diode has the requested emission characteristic. The driving 208 may in this case be a repeated process as described above, in which the actuator repeatedly carries out a movement in which the optical element is respectively displaced stepwise. It is advantageous to carry out initialization, in which the system is first brought into a defined starting position from which positioning is then carried out in a controlled way.

The steps 202, 204, 206, 208 may be carried out repeatedly. Thus, in response to a further request of a further emission characteristic for the light-emitting diode, a further position for the optical element may then be determined and, on the basis of the further position, a further actuator adjustment path may be defined in order to move the optical element into the further position. As soon as the optical element is in the further position, the light-emitting diode has the requested further emission characteristic.

The desired emission characteristic may for example be specified by a user via a user interface or by a sensor signal, for example of a sensor detecting the brightness in the vicinity of the light-emitting diode.

Figure 3:
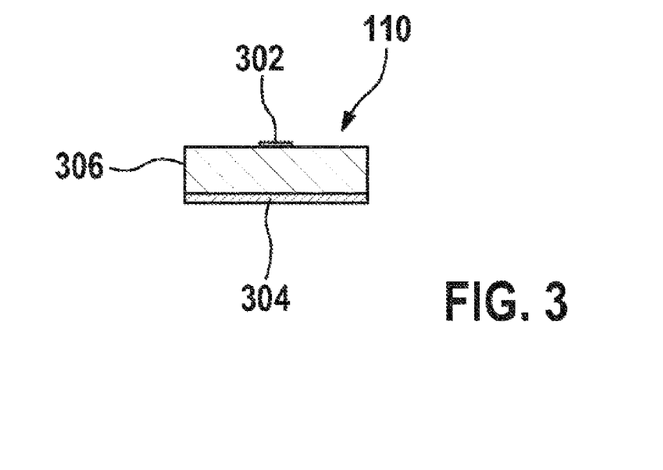
FIG. 3 shows a representation of a light-emitting diode.

FIG. 3 shows a representation of an LED wafer 110, chip or "bare die". The LED wafer 110 consists of the luminescent substrate. The LED wafer 110 has a cuboid configuration with a square base surface. This exemplary embodiment shows an LED chip having a base surface of about 400 μm times 400 μm. On an upper side, the LED wafer 110 has a dielectric passivation. Diagonally across the upper side, the LED wafer 110 has contact fingers which are connected at a point of intersection in the middle of the upper side by a round bond pad 302, for example of gold with a diameter of about 100 μm. A lower side of the LED wafer 110 has backside metallization 304. A section through the LED wafer 110 (die cross section) perpendicular to the surface is represented in FIG. 3. The LED wafer 110 has a thickness t 306 of about 200 μm. On the upper side, the gold bond pad 302 is located as a cathode or negative terminal. On the lower side, the backside metallization 304 with a thickness of a few micrometers of AuSn (gold/tin) is located as the anode or positive terminal. The LED wafer 110 may be part of the diode shown in FIG. 1.

The LED wafer 110, as represented in FIG. 3, may be fastened on a base with a housing. The size is then typically in a range of about 4 mm times 4 mm times 2 mm. The base may have two test contacts, also suitable for gold wire bonding, on the upper side. Centrally on the base, above the LED wafer 110, there may be a lens of transparent plastic which protects the LED wafer 110 against mechanical influences. On the lower side, the base may have two solder contacts and a heat sink between the two solder contacts. The two test contacts on the upper side may respectively be arranged in the upper corners of the base. The LED wafer 110 may be located centrally on the base. 110. The lens may be raised semicircularly over the LED wafer 110. The two lower-side solder contacts may be arranged along a left edge and a right edge of the base. The heat sink may be arranged centrally parallel to the solder contacts, opposite the LED wafer 110, and extend from an upper edge of the base to a lower edge of the base.

A high-power LED relevant for lighting purposes has, as a pure semiconductor die 110 or substrate 110, a size of typically several hundred µm and a thickness of about 200 µm, as represented in FIG. 3. In general, this die 110 is mounted via a backside contact 304 on a base and connected on the front side via a wire bond 302. The base undertakes the thermal dissipation onto the backside and the electrical contacting. The light emission may be shaped or modified by means of a lens firmly applied on the base. This layer, usually consisting of a polymer, simultaneously protects the die 110 and a luminescent layer optionally applied onto the die 110. By this structure with a single lens, the volume of the LED is increased by a factor of 1000. For the production of an illumination device, the structure also requires further significantly larger components, for example additional lenses, scattering disks and reflectors.

Figure 4:
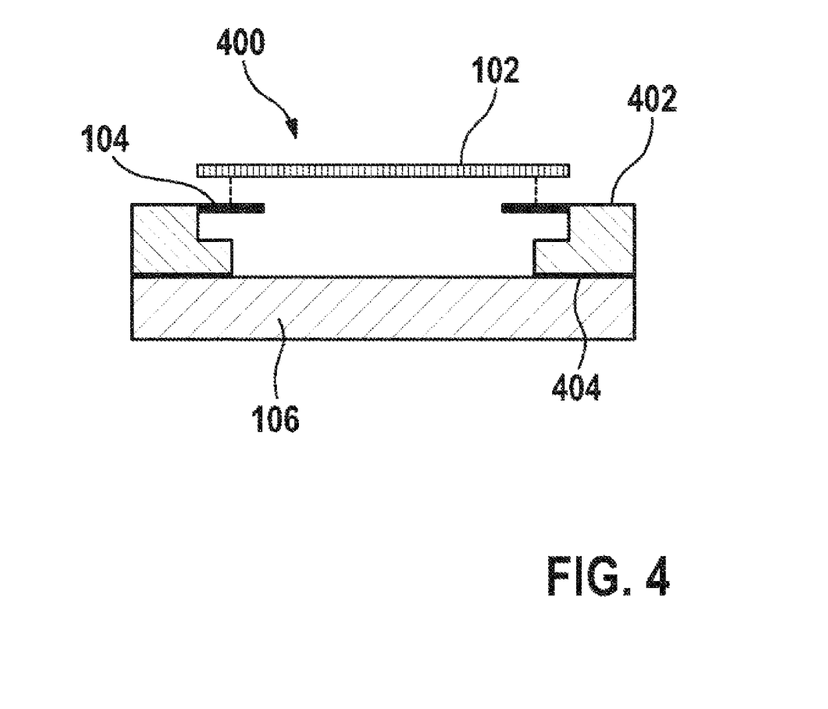
FIG. 4 shows a representation of a light system having a variable emission characteristic according to an exemplary embodiment of the present disclosure.
Figure 5:
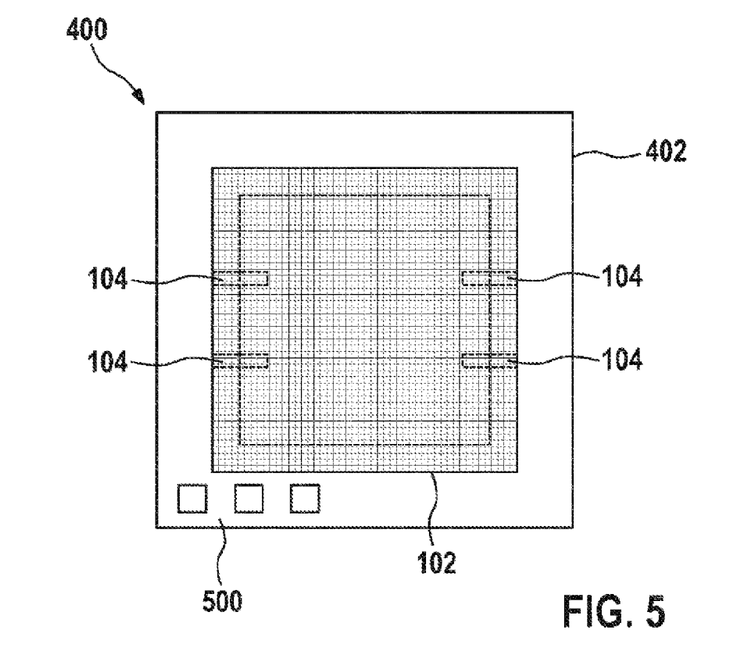
FIG. 5 shows a representation of a light system having a variable emission characteristic according to an exemplary embodiment of the present disclosure.

FIGS. 4 and 5 show a section and a plan view of a light system 400 having a variable emission characteristic according to an exemplary embodiment of the present disclosure. In other words, FIGS. 4 and 5 show an example of production of an LED optical unit with, directly bonded to one another, an LED 106 and frame 402 with actuators 104.

FIG. 4 shows a sectional representation through the light system 400. A frame 402 with micromechanical actuators 104 for moving an optical element is fastened on to a light-emitting diode 106. The frame 402 is connected by means of a bonding connection 404 directly to a carrier circuit board of the light-emitting diode 106. The frame 402 has a circumferential recess, into which the actuators 104 can move the optical element 102 in order to vary a vertical distance between the optical element 102 and the light-emitting diode 106. The optical element 102, for example a Fresnel lens, is applied firmly onto the actuators 104 or, for an inertial drive, is pressed onto the frame 402 by springs. In this way, the optical element 102 can be displaced horizontally by the actuators 104 when, during actuation, the actuators 104 overcome a friction force by which the optical element 102 is fixed by the springs when the actuators 104 are not actuated.

FIG. 5 shows a plan view of the light system 400. The optical element 102 is moved by four actuators 104 in this exemplary embodiment. The optical element 102 and the frame 402 have a square shape. The actuators 104 are formed in order to move the optical element 102 in at least one direction of an extent plane of the optical element 102. To this end, the actuators 104 are arranged on two opposite sides of the optical element 102. In order to move the optical element 102 in a further direction of the extent plane, further actuators 104 (which are not represented here) are arranged on two further opposite sides of the optical element 102. Electrical contact points 500 are arranged on a region of the frame 402 which is not covered by the optical element 102. The electrical contact points 500 may be used in order to supply the actuators 104 and/or the light-emitting diode 106 with electrical energy. The electrical contact points 500 may be configured as bond pads. From the electrical contact points 500, electrical leads may be fed through the frame 402 to the actuators 104, and to the light-emitting diode 106.

FIGS. 4 and 5 show an LED 106 for lighting purposes with a MEMS-actuated optical unit 102. This combination may be referred to as MEMS LED.

By a combination of an LED 106 as the light source, an optical unit 102 located directly thereon and an actuator system 104 which is produced fully or partially in silicon micromechanics, it is possible to produce a very compact lamp whose light distribution is controllable. By parallelizaton of a plurality of these individual lamps, for example by a structure on a respective individual or common carrier, very powerful lamps or illumination can be produced.

The externally controllable optical system 102 proposed here may be based either on an optical mirror unit 102 or on a lens system 102, preferably a Fresnel lens. When using silicon, the use and integration of metallized silicon surfaces or surfaces with dielectric mirror layers is suitable for an optical mirror unit 102. The size of the overall unit 400 in this case lies in a range of less than 10 mm×10 mm×10 mm, so that the overall system 400 is no larger than a currently available LED 106 with a housing.

The lens 102 or the mirror 102 is moved in at least one spatial direction in the relative position with respect to the light source 106. This is carried out in the focus direction, in order to generate wider or narrower light emission, and/or in a plane perpendicular thereto, in order to be able to modify the direction of the light emission.

The actuation may, in particular be carried out electrostatically or electrothermally, although other actuator principles may also be envisioned, for example electromagnetic or piezoelectric. In this case, the optical system 102 may optionally be continuously actuated dynamically, and is advantageously connected rigidly to the actuator 104 for this purpose. This, however, requires a continuous voltage supply, or drive. As an alternative, the actuation may be carried out energylessly in a remanent fashion, in which case the optical system 102 is preferably held in position by a friction-based system. The actual actuation is then carried out, for example, by means of an inertial drive.

The actuator 104 may be connected directly, for example by wafer bonding, to the LED 106 by means of a frame 402, for which purpose it is advantageous to modify the electrical connection of the LED 106, for example in the form of a contact frame 402 with fingers 404 from the outside inward, as represented in FIG. 4, instead of a central contact with fingers from the inside outward as represented in FIG. 3. In the case of a conductive embodiment, or coating, the actuator frame 402 may thus be used directly for electrical contacting of the LED 106. As an alternative, it is also possible to connect the LED 106 and actuator 104 to one another by means of packaging, in particular by means of a carrier or a base.

If the optical system 102 adheres to the frame 402, or if it is pressed for example by means of a spring (not shown in FIG. 4), a friction bearing of the optical system 102 with a large displacement path is possible when the actuator 104 is configured in such a way that it can be moved in a plurality of spatial directions. By a first movement of the actuators 104 perpendicularly to the plane of the optical element 102, the latter is raised from a basic position fixed by friction on the frame 402. Slight displacement of the optical element 102 in at least one further spatial direction parallel to the LED 106 is then possible.

After this positioning of 102, the basic position in the first direction is resumed by the actuators 104, whereupon a fixed position of 102 can be produced by friction between 102 and 402. The actuators 104 can subsequently be moved back into a basic position without contact with the optical system 102, and the optical element 102 can again be first raised and then displaced. By multiple repetition of this process, a very much larger displacement path of the optical element 102 can be produced with a small displacement path of the actuator 104.

Figure 6A:
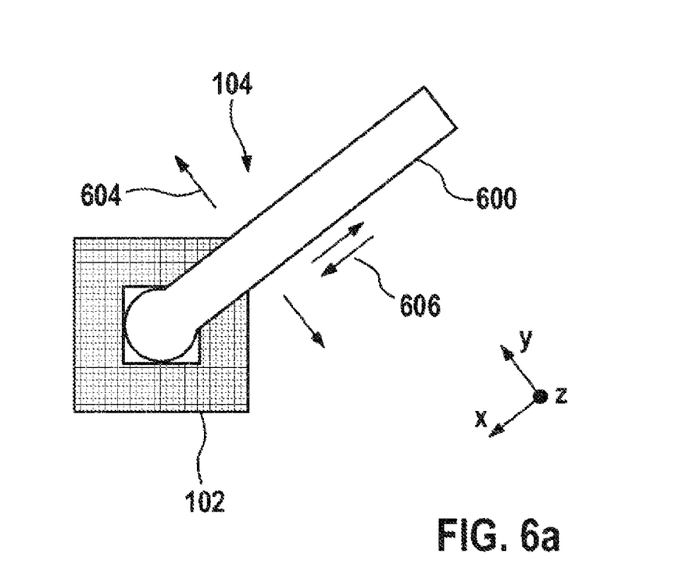
FIGS. 6a and 6b show representations of a bearing lever and a bearing point in the optical element according to an exemplary embodiment of the present disclosure.
Figure 6B:
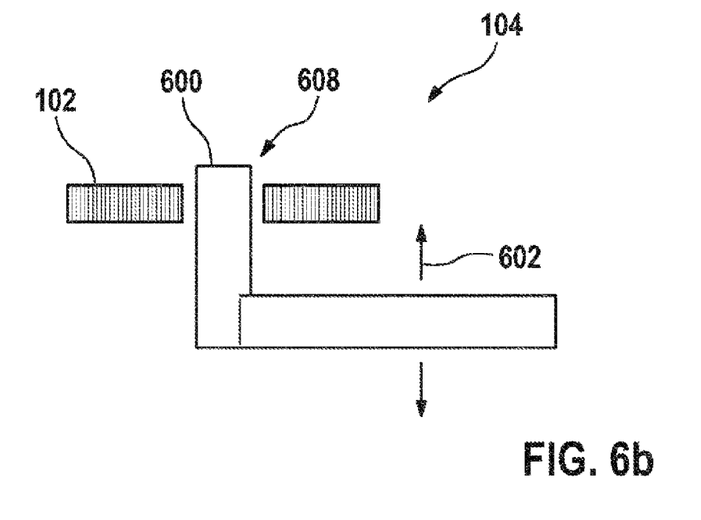

FIGS. 6a and 6b show a view from below and a sectional representation of a bearing lever 600 and a bearing point in an optical element 102, shown only as a detail, according to an exemplary embodiment of the present disclosure. The micromechanically actuated bearing lever 600 is formed in order to move the optical element 102 in the three spatial directions 602, 604, 606. In a y direction 604, and in an x direction 606, the optical element 102 is guided by direct contact with the bearing lever 600. In the z direction 602, the bearing lever 600 is mounted in a mobile fashion by means of a friction bearing 608. The actuator 104 is formed at one end as a bearing lever 600, in order to transmit movements of the actuator 104 to the optical element 102. The optical element 102 may, for example, be a Fresnel lens.

The bearing lever 600 is represented from below in FIG. 6a, in the way in which the bearing lever 600 engages into a recess in the optical element 102. The recess is configured in a square shape in this exemplary embodiment. The bearing lever 600 is aligned along one of the diagonals of the square recess. The bearing lever 600 has a bearing pin which, in the recess, has points of contact with the optical element 102 on straight sides of the square recess. Owing to the points of contact, the optical element 102 can be clamped with a defined force on the bearing pin of the bearing lever 600.

In FIG. 6b, the bearing lever 600 is represented in a side view. The bearing pin of the bearing lever 600 is aligned perpendicularly to a main extent plane of the optical element 102. The optical element 102 can be moved up and down in the z direction 602 on the bearing pin. When the actuator 104 executes a rapid movement, a mass inertia of the optical element 102 can overcome the friction force in the friction bearing 608, and the optical element 102 moves along the bearing pin. When the actuator 104 executes a slow movement, the friction force in the friction bearing 608 is greater than the mass inertia of the optical element 102, and the optical element 102 is carried along by the bearing lever 600.

FIGS. 6a and 6b show an exemplary embodiment of an individual actuator 104 according to the approach proposed here. The suspension is actuated in a remanent fashion in one dimension, here in the focus direction 602, and continuously dynamically in two dimensions 604, 606 perpendicular thereto.

An exemplary embodiment of an individual suspension for an optical system 102 which is mobile in three dimensions is shown. The suspension is remanent in the dimension in the focus direction, here the z direction 602. By means of an inertial drive and friction bearing 608, the optical unit 102 can be displaced in the z direction 602, as shown on the bottom right in FIG. 6b as a cross section. In the two dimensions perpendicular thereto, 604, 606, the optical unit can be continuously actuated dynamically, as shown as a plan view in FIG. 6a.

Figure 7:
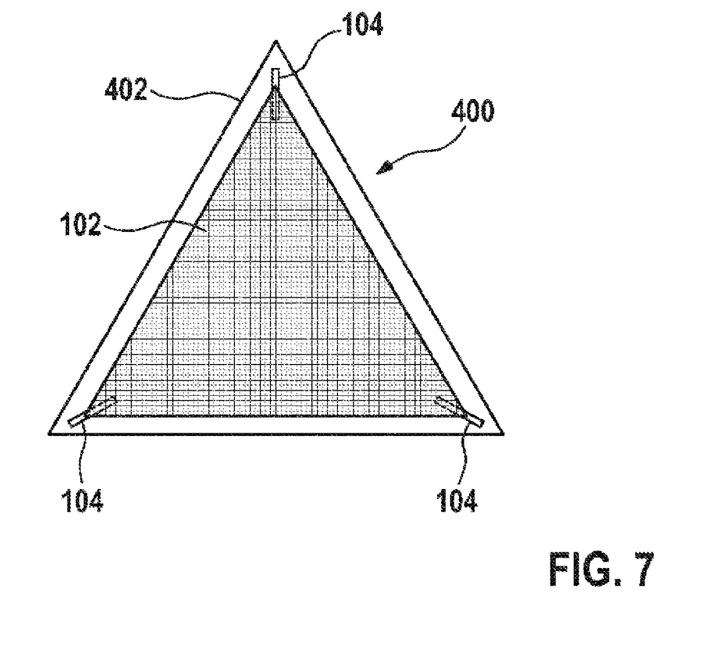
FIG. 7 shows a representation of a light system having a variable emission characteristic with three actuators, according to an exemplary embodiment of the present disclosure.

FIG. 7 shows a representation of a light system 400 according to an exemplary embodiment of the present disclosure. The light system 400 has a triangular shape. A frame 402 and an optical element 102 are shown, each of which is configured triangularly. For movement of the optical unit 102 in a plurality of dimensions, it is advantageous to fasten the optical unit 102 on three support points. A very suitable shape for this is a triangle, which can readily be produced both for the LED and for the actuator 104. An actuator with a bearing lever is arranged in each of the three vertices. In this way, the optical element 102 can be moved particularly straightforwardly by just three actuators 104.

Owing to the triangular shape of the light system 400, many light systems 400 of the same type can be arranged closely next to one another. In this way, a very high packing density can be achieved. Lights which are constructed with triangular or, for example, hexagonal light systems 400 can have a very homogeneous light distribution and high light intensity. The individual light systems 400 can be driven synchronously.

In other words, FIG. 7 shows an exemplary embodiment of the present disclosure for an LED, optimized for three suspension points, with an optical unit 102. The triangular shape permits displacement of the optical unit 102 in all directions with the smallest possible number of actuators 104. During production, sawing can likewise be carried out straightforwardly with a regular shape, which leads to 3 cutting directions instead of two for the rectangular die.

Figure 8:
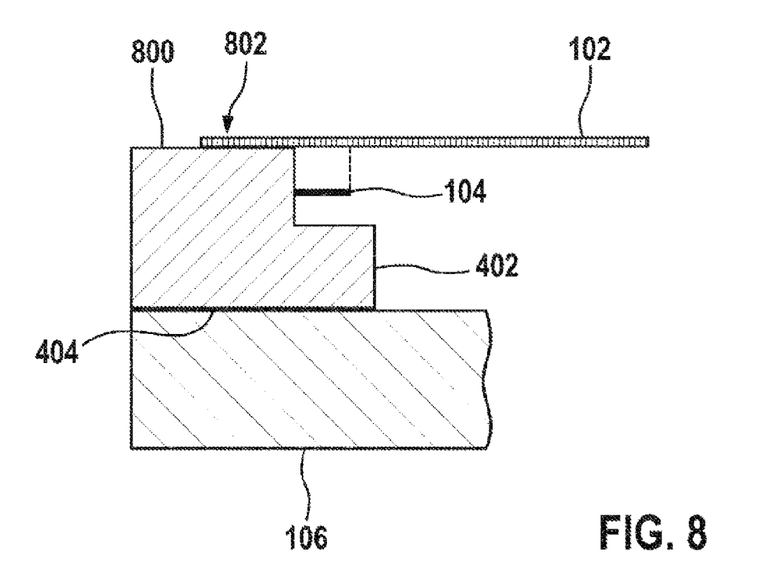
FIG. 8 shows a representation of a light system having a variable emission characteristic and a friction bearing, according to an exemplary embodiment of the present disclosure.

FIG. 8 shows an exemplary embodiment of production of an LED optical unit with a friction bearing of the optical unit 102 on a section of a frame 402 as described with the aid of FIG. 4. The frame 402 has a support surface 800, which is arranged on a side of the frame 402 lying opposite the LED 106. An edge region of the optical element 102 bears on the support surface 800. The friction bearing on the support surface 800 may be produced by adhesion or cohesion 802 of the surfaces, or by suitable coatings or materials. For example, a fluid may be arranged between the optical unit 102 and the frame 402. In this case, the adhesion or cohesion 802 between the frame 402 and the optical unit 102, for example a Fresnel lens, may fix the optical unit 102 in a resting state of the actuators 104. The actuator 104 which is formed is configured without a fixed connection to the optical unit 102 in a resting state. The micromechanical actuator 104 projects out of the frame 402. The frame 402 is connected to the section of the LED die 106 by means of a bond connection 404.

Figure 9:
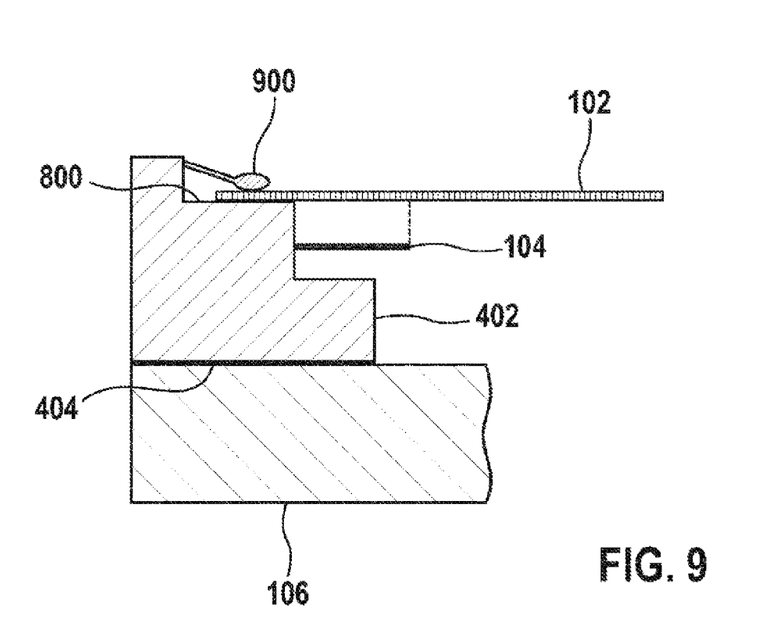
FIG. 9 shows a representation of a light system having a variable emission characteristic and a spring bearing, according to an exemplary embodiment of the present disclosure.

FIG. 9 shows an exemplary embodiment of production of an LED optical unit with friction bearing of the optical unit 102 on a section of a frame 402 as described with the aid of FIG. 4. An edge region of the optical element 102 bears on a support surface 800. The frame 104 has a support, on which the optical element 102 bears. As a result of the support, a lateral projection is formed which extends beyond the optical element 102. A spring 900 is arranged on the projection, or on another suitable position of the frame 104. A free end of the spring 900 bears on a surface of the optical element 102 lying opposite the diode 106. The spring 900 generates a force on the optical unit 102, so that the latter is pressed onto a support surface 800 of the frame 402. Friction then occurs between the optical unit 102 and the frame 402, and the optical unit 102 is fixed. With the actuators 104, the optical unit 102 can be raised from the frame 402 and then displaced. The friction between the optical unit 102 on the spring 900 is, for example, minimized by rounding of the spring 900. The friction between the actuator 104 and the optical unit 102 is, for example, increased as far as possible by a tip on the actuator. The actuator 104 which is formed is configured without a fixed connection to the optical unit 102 in a resting state. The micromechanical actuator 104 projects out of the frame 402. The frame 402 is connected to the section of the LED die 106 by means of a bond connection 404.

Figure 10:
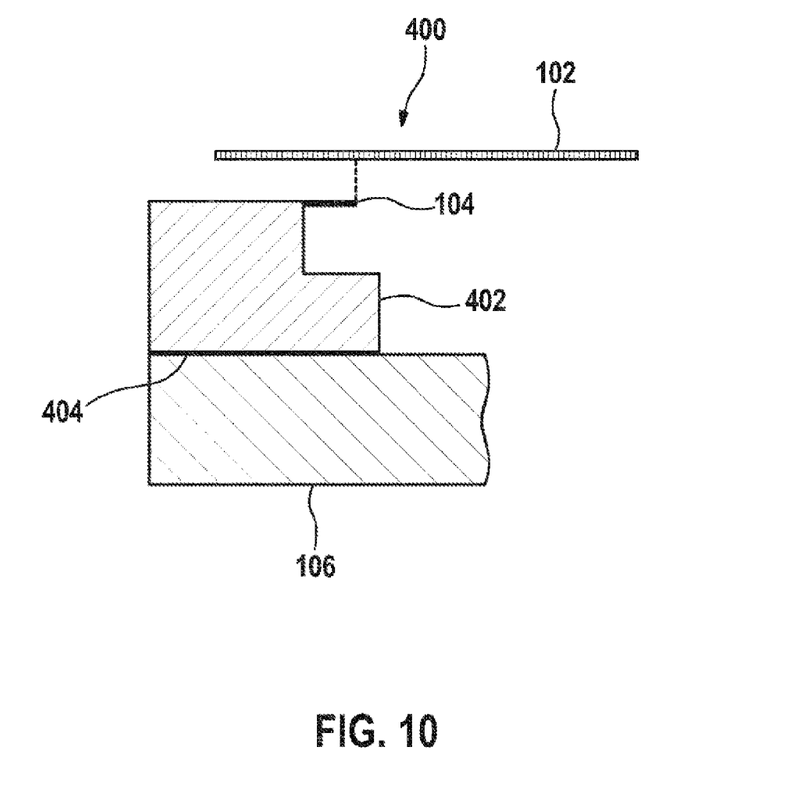
FIG. 10 shows a representation of a light system having a variable emission characteristic and a fixed bearing, according to an exemplary embodiment of the present disclosure.

FIG. 10 shows a detail of the sectional representation, shown in FIG. 4, through the light system 400 according to an exemplary embodiment of the present disclosure. The frame 402 is connected to the LED die 106 by means of a bond connection 404. The micromechanical actuator 104 projects out of the frame 402. The LED optical unit 102 is applied firmly on the actuators 104. This may also be achieved by a friction bearing, as described in FIG. 6a. In the exemplary embodiment shown, the optical element 102 can additionally be displaced perpendicularly with respect to the diode 106 and retained. Conversely, movement in an extent plane of the optical element is restricted to a displacement path of the actuator.

The exemplary embodiments described, and shown in the figures, are selected merely by way of example. Various exemplary embodiments may be combined with one another fully or in respect of individual features. An exemplary embodiment may also be supplemented by features of a further exemplary embodiment. Method steps according to the disclosure may furthermore be repeated, and also carried out in a sequence other than that described.

The invention claimed is:

1. A device for manipulating an emission characteristic of a light-emitting diode, comprising:
    an optical element configured to be arranged movably relative to the light-emitting diode between a first position and at least one further position, the optical element being further configured to induce a first light distribution of the light emitted by the light-emitting diode when the optical element is arranged in the first position and to induce a further light distribution of the light emitted by the light-emitting diode when the optical element is arranged in the at least one further position; and
    at least one micromechanical actuator configured to move the optical element between the first position and the at least one further position to manipulate the emission characteristic, wherein the actuator has a friction bearing as an interface between the optical element and the actuator.

2. The device as claimed in claim 1, wherein the actuator is configured to move the optical element one or more of perpendicularly and parallel to a main extent plane of the light-emitting diode.

3. The device as claimed in claim 1, wherein the optical element is configured as a lens, an optical grating, or an optical mirror unit.

4. The device as claimed in claim 1, wherein the micromechanical actuator is configured as one or more of an electrostatic, thermal, piezoelectric, and magnetic actuator.

5. The device as claimed in claim 1, wherein the actuator has a bearing lever configured to move the optical element in at least one spatial direction.

6. The device as claimed in claim 1, further comprising a frame enclosing the light-emitting diode, wherein the actuator is connected to the frame.

7. The device as claimed in claim 6, wherein the frame has at least one supply conductor configured for one or more of the actuator and the light-emitting diode.

8. The device as claimed in claim 6, wherein the frame has a support surface configured to bear the optical element displaceably, and wherein a retaining force induced by one or more of adhesion, cohesion, and a spring acts between the optical element and the support surface.

9. The device as claimed in claim 1, further comprising:
    a first actuator connected to a first corner of the optical element in order to move the optical element;
    a second actuator connected to a second corner of the optical element in order to move the optical element; and
    a third actuator connected to a third corner of the optical element in order to move the optical element.

10. A light system having a variable emission characteristic, comprising:
    a light-emitting diode; and
    a device configured to manipulate an emission characteristic of the light-emitting diode, the device including:
        an optical element configured to be arranged movably relative to the light-emitting diode between a first position and at least one further position, the optical element being further configured to induce a first light distribution of the light emitted by the light-emitting diode when the optical element is arranged in the first position and to induce a further light distribution of the light emitted by the light-emitting diode when the optical element is arranged in the at least one further position; and
        at least one micromechanical actuator configured to move the optical element between the first position and the at least one further position to manipulate the emission characteristic,
    wherein a first end of the actuator is connected to the optical element, and a second end of the actuator is connected to the light-emitting diode.

11. A method for manipulating an emission characteristic of a light-emitting diode of a light system comprising the light-emitting diode, an optical element and at least one micromechanical actuator, wherein the optical element is arranged movably relative to the light-emitting diode between a first position and at least one further position, and is configured to induce a first light distribution of the light emitted by the light-emitting diode when the optical element is arranged in the first position and to induce a further light distribution of the light emitted by the light-emitting diode when the optical element is arranged in the at least one further position, and wherein the actuator is configured to move the optical element between the first position and the at least one further position, the method comprising:
    driving the at least one actuator with a drive signal configured to move the optical element so as to manipulate the emission characteristic.

12. The device as claimed in claim 9, wherein the optical element is configured as a lens, an optical grating, or an optical mirror unit.

13. A device for manipulating an emission characteristic of a light-emitting diode, comprising:
    an optical element configured to be arranged movably relative to the light-emitting diode between a first position and at least one further position, the optical element being further configured to induce a first light distribution of the light emitted by the light-emitting diode when the optical element is arranged in the first position and to induce a further light distribution of the light emitted by the light-emitting diode when the optical element is arranged in the at least one further position; and
    at least one micromechanical actuator configured to move the optical element between the first position and the at least one further position to manipulate the emission characteristic, wherein the optical element is configured as a lens, an optical grating, or an optical mirror unit.

14. The device as claimed in claim 13, wherein the micromechanical actuator is configured as one or more of an electrostatic, thermal, piezoelectric, and magnetic actuator.

15. The device as claimed in claim 13, wherein the actuator has a bearing lever configured to move the optical element in at least one spatial direction.

16. The device as claimed in claim 13, further comprising a frame enclosing the light-emitting diode, wherein:
    the actuator is connected to the frame;
    the frame has a support surface configured to bear the optical element displaceably; and
    a retaining force induced by one or more of adhesion, cohesion, and a spring acts between the optical element and the support surface.

17. A device for manipulating an emission characteristic of a light-emitting diode, comprising:
    an optical element configured to be arranged movably relative to the light-emitting diode between a first position and at least one further position, the optical element being further configured to induce a first light distribution of the light emitted by the light-emitting diode when the optical element is arranged in the first position and to induce a further light distribution of the light emitted by the light-emitting diode when the optical element is arranged in the at least one further position; and at least one micromechanical actuator configured to move the optical element between the first position and the at least one further position to manipulate the emission characteristic, the at least one micromechanical actuator including:

a first actuator connected to a first corner of the optical element in order to move the optical element;

a second actuator connected to a second corner of the optical element in order to move the optical element; and a third actuator connected to a third corner of the optical element in order to move the optical element.

18. The device as claimed in claim 17, wherein the optical element is configured as a lens, an optical grating, or an optical mirror unit.

19. The device as claimed in claim 17, wherein the actuator has a bearing lever configured to move the optical element in at least one spatial direction.

20. The device as claimed in claim 17, further comprising a frame enclosing the light-emitting diode, wherein:

the actuator is connected to the frame;

the frame has a support surface configured to bear the optical element displaceably; and a retaining force induced by one or more of adhesion, cohesion, and a spring acts between the optical element and the support surface.

* * * * *